(12) United States Patent
Cheng et al.

(10) Patent No.: US 8,979,575 B2
(45) Date of Patent: Mar. 17, 2015

(54) ELECTRICAL CONNECTOR ASSEMBLY HAVING ASSISTANT HEAT DISSIPATING DEVICE

(71) Applicant: Hon Hai Precision Industry Co., Ltd., New Taipei (TW)

(72) Inventors: Chih-Pi Cheng, New Taipei (TW); Andrew Cheng, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 77 days.

(21) Appl. No.: 13/893,358

(22) Filed: May 14, 2013

(65) Prior Publication Data
US 2013/0323964 A1    Dec. 5, 2013

(30) Foreign Application Priority Data
Jun. 5, 2012   (TW) .............................. 101210761 U

(51) Int. Cl.
| | |
|---|---|
| *H01R 13/00* | (2006.01) |
| *H05K 7/20* | (2006.01) |
| *H01L 23/427* | (2006.01) |
| *H05K 7/10* | (2006.01) |
| *H01L 23/32* | (2006.01) |
| *H01L 23/40* | (2006.01) |

(52) U.S. Cl.
CPC ............ *H05K 7/2039* (2013.01); *H01L 23/427* (2013.01); *H05K 7/1007* (2013.01); *H01L 23/32* (2013.01); *H01L 23/4006* (2013.01)
USPC ........................................................ 439/487

(58) Field of Classification Search
CPC ............ H01L 23/427; H01L 2023/405; H01L 2023/4087; H01L 24/72
USPC ................................... 439/487, 485, 71, 331
See application file for complete search history.

(56) References Cited

U.S. PATENT DOCUMENTS

| | | | | |
|---|---|---|---|---|
| 5,302,853 | A  * | 4/1994 | Volz et al. ....................... | 257/707 |
| 5,493,475 | A  * | 2/1996 | Lin ................. | 361/710 |
| 8,021,179 | B1 * | 9/2011 | Wertz ............................. | 439/331 |
| 8,593,813 | B2 * | 11/2013 | Wertz ............................. | 361/719 |

* cited by examiner

*Primary Examiner* — Xuong Chung Trans
(74) *Attorney, Agent, or Firm* — Wei Te Chung; Ming Chieh Chang

(57) ABSTRACT

An electrical connector assembly for use with an electronic package, includes an electrical connector having a plurality of contacts, and an assistant heat sink mounted upon the electrical connector and having an opening to allow the electronic package connecting with the contacts.

20 Claims, 6 Drawing Sheets

ELECTRICAL CONNECTOR ASSEMBLY HAVING ASSISTANT HEAT DISSIPATING DEVICE

BACKGROUND OF THE INVENTION

1. Field of the Invention

The present invention relates to an electrical connector assembly, and more particularly to the electrical connector assembly having an assistant heat device to dissipate heat for an electronic package mounted on an electrical connector thereof.

2. Description of Related Art

Competition and market demands have continued the trends toward faster, higher performance with regard to computer systems, especially to an electronic package. The faster and higher performance of the electronic package will increase the power and generate a great deal of heat. Therefore, a better heat sink system is needed for heat dissipating fast for protecting the electronic package of the computer system. A conventional method for fast dissipating heat is increase the number of heat plates defined on the heat sink. Without doubt, said conventional method will make the heat sink have a large bulk so that a large space is need for mounting. As we all known, the printed circuit board is used for mounting the heat sink and has a sure limited surface, so that the heat sink could not enlarge too big.

Thus, an improved electrical connector is needed for heat dissipating.

SUMMARY OF THE INVENTION

An object of the present invention is to provide an electrical connector assembly for electrically connecting an electronic package and a printed circuit board, the electrical connector has an assistant heat sink to help dissipating heat for the electronic package so that the heat generated by the electronic package will be dissipate quickly and the electrical connector assembly can be received in the predetermined space on a printed circuit board.

According to one aspect of the present invention, an electrical connector assembly for use with an electronic package, comprises an electrical connector having a plurality of contacts; and an assistant heat sink mounted upon the electrical connector for dissipating heat of the electronic package and having an opening to allow the electronic package connecting with the contacts.

According to another aspect of the present invention, an electrical connector assembly, comprises an electrical connector, an electronic package mounted upon the electrical connector, and an assistant heat sink. The assistant heat sink includes a heat frame mounted between the electrical connector and the electrical connector and a heat pipe associated with the heat frame. Wherein the inner edges of the heat frame of the assistant heat sink is pressed by the electronic package.

Other objects, advantages and novel features of the invention will become more apparent from the following detailed description of a preferred embodiment when taken in conjunction with the accompanying drawings.

DETAILED DESCRIPTION OF THE INVENTION

Figure 1:
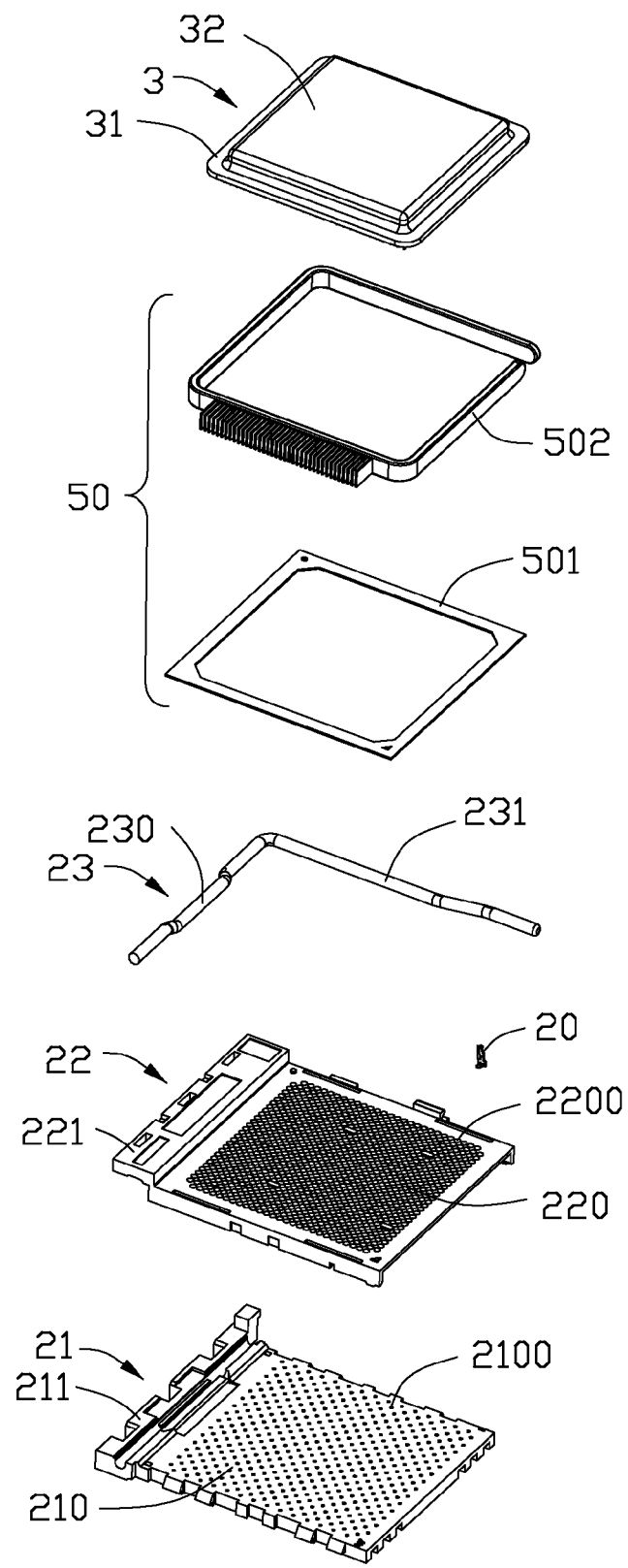
FIG. 1 is an exploded perspective view of the electrical connector assembly in accordance with a first embodiment of the present invention, without showing a main heat sink.
Figure 2:
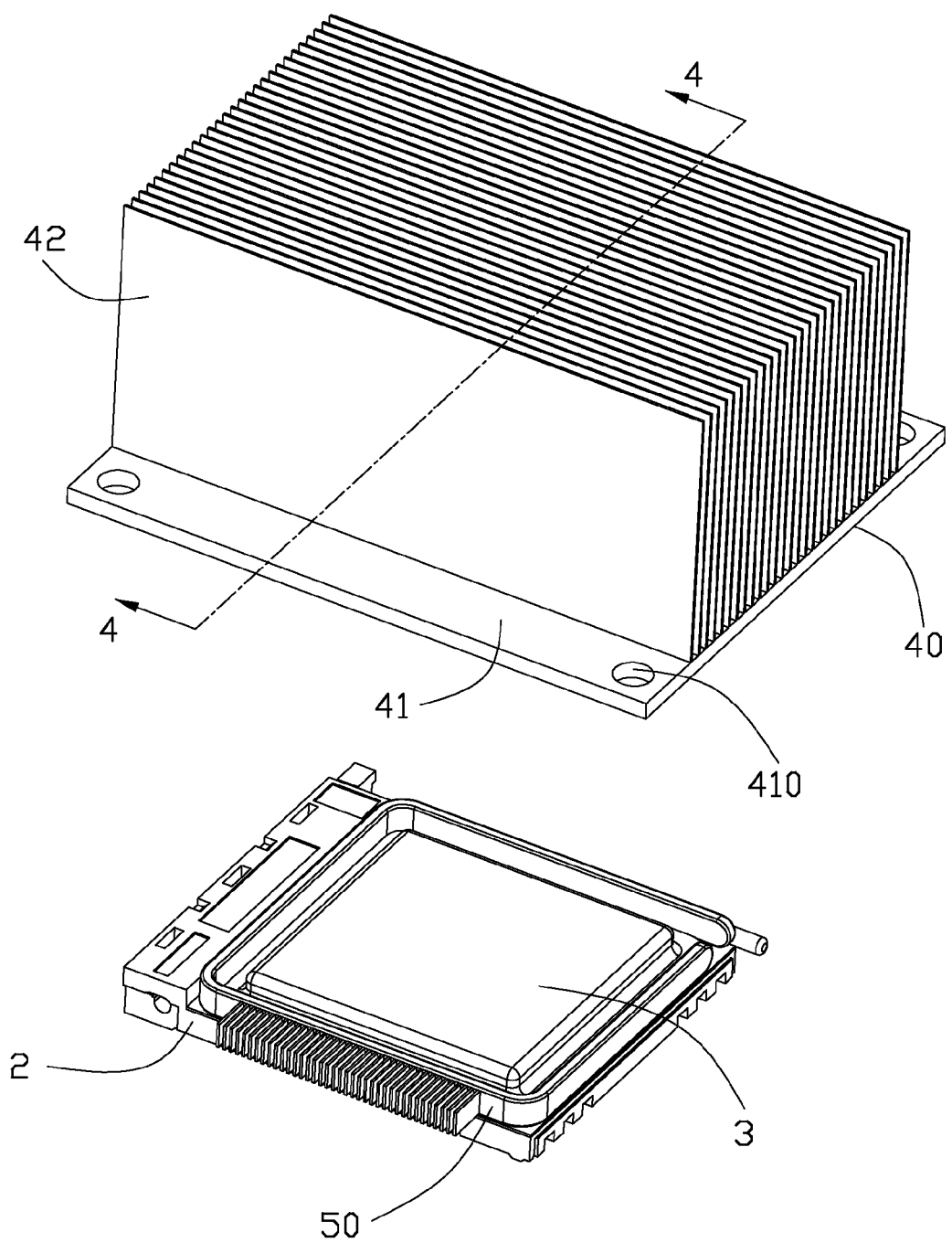
FIG. 2 is an assembled, perspective view of an electrical connector assembly, and wherein the main heat sink is in a free position.

As shown in FIGS. 1 and 2, an electrical connector assembly according to the first embodiment in the instant invention, comprises an electrical connector 2, an electronic package 3 mounted upon the electrical connector 2, and a heat sink device.

Figure 3:
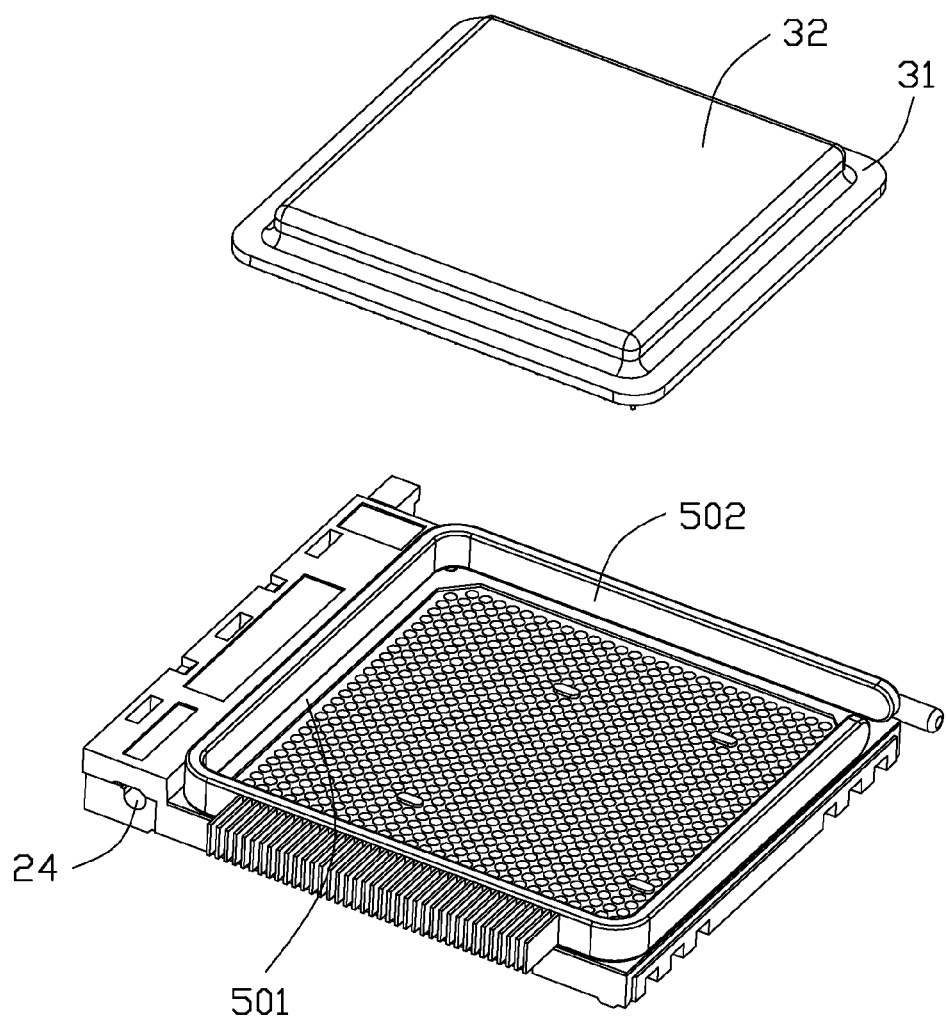
FIG. 3 is a partial assembled, perspective view of the electrical connector assembly shown in FIG. 1.

Referring to FIGS. 1 and 3, the electrical connector 2 includes an base 21, a plurality of contacts 20 (only shown one and omitted others) received in the base 21, a cover 22 mounted upon the base 21, and an actuator 23 positioned between the cover 22 and the base 21. The base 21 has a substantially rectangular shape, includes a receiving area 210 defining a plurality of passageways 2100 and a head portion 211 higher than the receiving area 210. The cover 22 defines a supporting area 220 corresponding to the receiving area 210 of the base 21 and an end portion 221 corresponding to the heat portion 211 of the base 21. The supporting area 220 defines a plurality of through holes 2200 corresponding to the passageways 2100 for the contacts 20 mating pins of the electronic package 3. The head portion 211 and the end portion 221 commonly formed with a recess 24 to receive the actuator 23. The actuator 23 in the instant invention is a lever comprising substantially perpendicular arranged a driving portion 230 and a handle portion 231. The handle portion 231 is exposed out of the base 210 and the cover 220 for rotating by an operator, so that the driving portion 230 rotates to make the cover 22 move along the base 21.

The electronic package 3 includes a substrate 31 located at bottom thereof and a die 32 located upon the substrate 31.

The heat sink device includes a main heat sink 40 located upon the electronic package 3. The main heat sink 40 has a bottom plate 41 with four holes 410 for receiving a plurality of screws (not shown) to fix to a printed circuit board (not shown). A plurality of heat plates 42 arrange on the bottom plate 41 to dissipate the heat transferred from the electronic package 3 to the bottom plate 41.

The heat sink device further includes an assistant heat sink 50 located between the main heat sink 40 and the electronic package 3. The assistant heat sink 50 comprises a heat frame 501 with an opening 5010 thereof and a heat pipe 502 associated with the heat frame 501. The heat frame plate 501 may weld to the heat pipe 502. The assistant heat sink 50 is assembled to the cover 22 of the electrical connector 2 under condition that the heat frame 501 is located around the supporting area 220 of the cover 22, and the through holes 2200 are exposed in an opening 5010 of the heat frame 501. The heat frame is formed by a flat plate with a closed shape. The heat pipe 502 is configured with a not closed loop structure and has a plurality of heat spread fins 5020 disposed on one side thereof.

Figure 4:
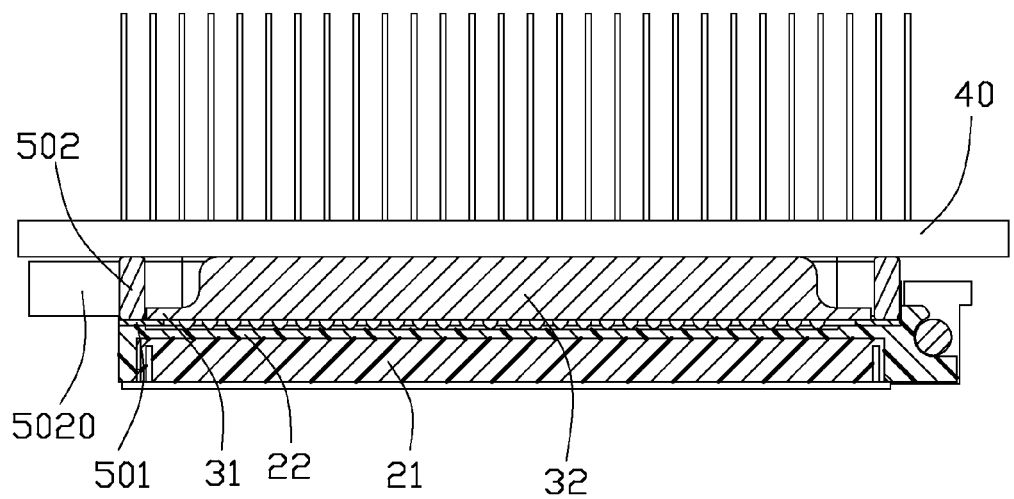
FIG. 4 is a cross-sectional view taken along line 4-4 of FIG. 2, wherein the main heat sink is assembled to an electrical connector of the electrical connector assembly.

FIG. 4 shows a cross sectional view of the instant electrical connector assembly. The electronic package 3 is assembled to the electrical connector 2 under a condition that the electronic package 3 presses the heat frame 501 and is surrounded by the heat pipe 502. After that, the cover 22 is droved by the actuator 23 to move loading the electronic package 3 associated with the assistant heat sink 50 to a final position. The main heat sink 40 is assembled to the electrical connector 2 after the electronic package 3 arrived at the final position. Under that condition, the bottom plate 41 of the main heat sink 40 contact with a top surface of the electronic package 3.

In the instant invention, the heat generated by the electronic package 3 has two ways to dissipate. One way is that the heat is transmitted and dissipated by the main heat sink 40. The another way is that the heat is transmitted and dissipated by the assistant heat sink 50. The heat frame 501 of the assistant heat sink 50 contacts with the substrate 31 of the electronic package 3 so that the heat can be transferred to the heat pipe 502 and dissipated by the heat pipe 502 and the heat spread fins 5020.

Figure 5:
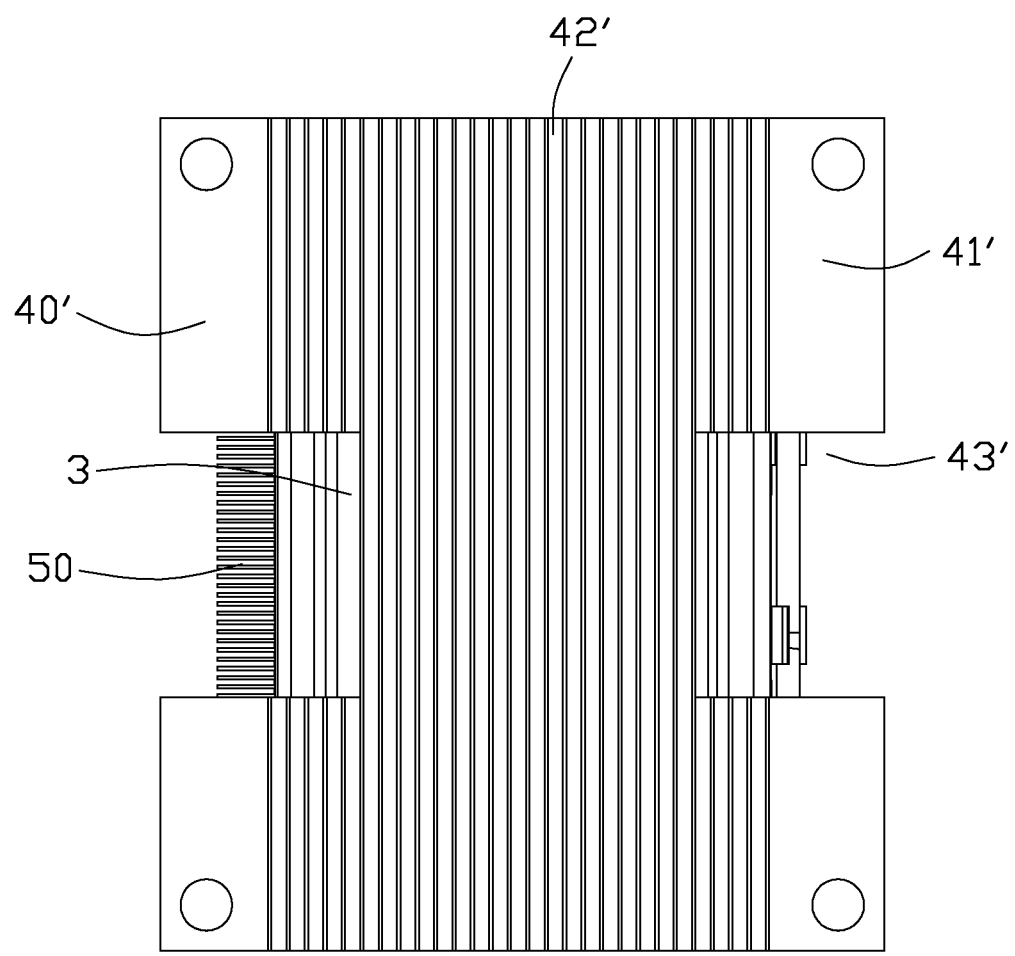
FIG. 5 is a top view of the electrical connector assembly in accordance with a second embodiment of the present invention.
Figure 6:
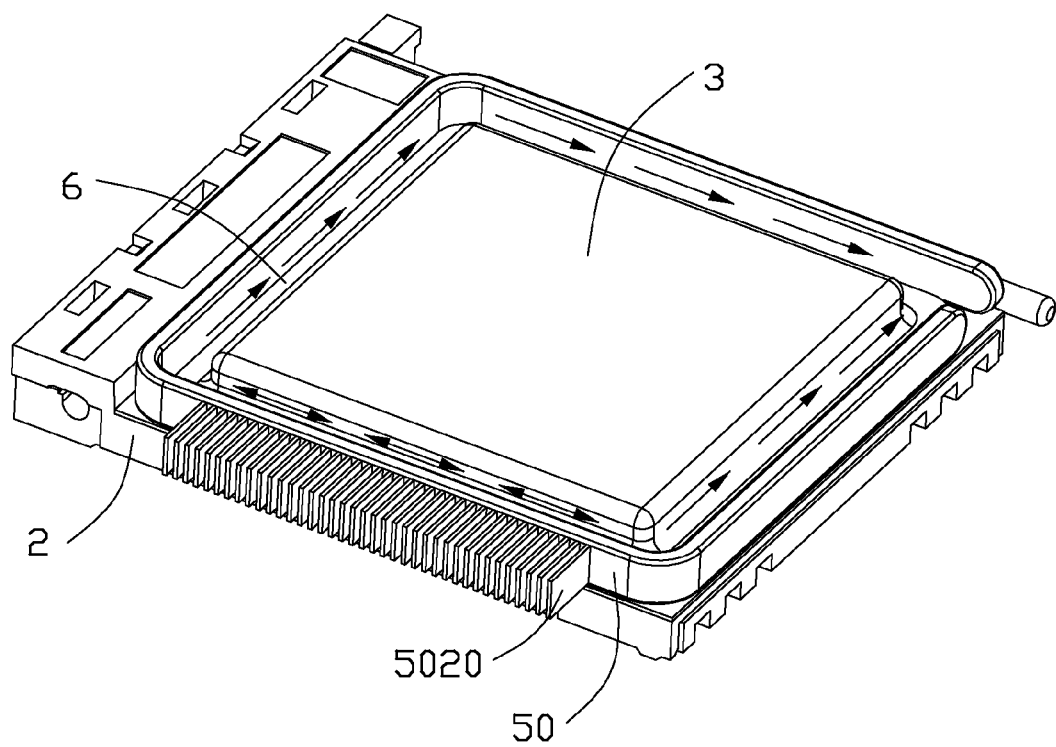
FIG. 6 is an assembled, perspective view of the electrical connector, an assistant heat sink and the electronic package, showing a road for heat transmitting.

FIGS. 5-6 show a second embodiment of the instant invention, which has a substantially similar structure with the first embodiment, but the main heat sink 40' has two recesses 43' defined on two opposite sides of the bottom plate 41'. The recesses 43' communicate the outer environment with a loop space 6 defined by the heat pipe 502 and the electronic package 3. The air flows from the outer environment into the space 6 and take the heat away from the space 6 along a line as showed in FIG. 6. In the instant invention, the heat spread fins 5020 is best arranged in a vertical direction which is the same with the heat plate 42, so that the assistant heat sink and the main heat sink can be synchronically cooled by a fan (not shown).

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly for use with an electronic package, comprising:
   an electrical connector having a plurality of contacts; and
   an assistant heat sink mounted upon the electrical connector and touching with the electronic package for dissipating heat of the electronic package, the assistant heat sink having an opening to allow the electronic package going through to connect with the contacts; wherein
   the assistant heat sink has a heat pipe configured with a not closed loop structure and surrounding the electronic package.

2. The electrical connector assembly as claimed in claim 1, wherein the assistant heat sink includes a heat frame with said opening and a heat pipe associated with the heat frame.

3. The electrical connector assembly as claimed in claim 2, wherein the heat frame weld with the heat pipe.

4. The electrical connector assembly as claimed in claim 2, wherein the heat frame is formed by a flat plate with a closed shape.

5. The electrical connector assembly as claimed in claim 2, wherein the heat pipe has a plurality of heat spread fins disposed one side therein.

6. The electrical connector assembly as claimed in claim 2, wherein the heat spread fins is located in a vertical direction.

7. The electrical connector assembly as claimed in claim 2, wherein the heat frame directly contacts and supports the electronic package and the heat pipe envelops the electronic package.

8. The electrical connector assembly as claimed in claim 1, wherein the electrical connector includes a base receiving said plurality of contacts, a cover mounted upon the base, and an actuator disposed between the cover and the base.

9. The electrical connector assembly as claimed in claim 8, wherein the cover and the assistant heat sink commonly move along the base.

10. An electrical connector assembly, comprising:
    an electrical connector;
    an electronic package mounted upon the electrical connector;
    an assistant heat sink include a heat frame mounted between the electronic package and the electrical connector and a heat pipe associated with the heat frame; and wherein
    the inner edges of the heat frame of the assistant heat sink are pressed by the electronic package.

11. The electrical connector assembly as claimed in claim 10, wherein the heat pipe has a not closed loop shape and envelops the electronic package.

12. The electrical connector assembly as claimed in claim 10, wherein the heat pipe has a plurality of heat spread fins located out of the loop shape.

13. The electrical connector assembly as claimed in claim 10, further comprising a main heat sink located upon the electronic package and directly contacting with electronic package.

14. The electrical connector assembly as claimed in claim 13, wherein the main heat sink includes a bottom plate and a plurality of heat plates extending upwardly from the bottom plate, and wherein the bottom plate has a recess at side thereof to communicate out environment and a space defined by the electronic package and the heat pipe.

15. An electrical connector assembly comprising:
    an insulative housing equipped with a plurality of contacts therein;
    an electronic package mounted upon the housing with a heat frame plate of an assistant heat sink sandwiched therebetween, said electronic package equipped with conductors extending downwardly through the heat frame plate to electrically connect with the contacts; and
    said assistant heat sink essentially located beside the electronic package.

16. The electrical connector assembly as claimed in claim 15, wherein the assistant heat sink is equipped, for heat dissipation, with fins which are discrete from the heat frame plate.

17. The electrical connector assembly as claimed in claim 16, wherein said fins extend laterally beside said electronic package.

18. The electrical connector assembly as claimed in claim 15, further including a primary heat sink intimately located upon the electronic package and equipped with fins, wherein said assistant heat sink contacts said primary heat sink.

19. The electrical connector assembly as claimed in claim 15, wherein said assistant heat sink includes a heat pipe structure surrounding said electronic package and being discrete from the heat frame plate.

20. The electrical connector assembly as claimed in claim 19, wherein said heat pipe structure forms essentially a frame structure in a top view to surround the electronic package while with a lateral opening to allow air in said frame structure to communicate with an exterior laterally.

\* \* \* \* \*